(12) United States Patent
Poelzl et al.

(10) Patent No.: US 8,652,906 B2
(45) Date of Patent: Feb. 18, 2014

(54) METHOD FOR MANUFACTURING A SEMICONDUCTOR DEVICE AND SEMICONDUCTOR DEVICE

(71) Applicant: Infineon Technologies Austria AG, Villach (AT)

(72) Inventors: Martin Poelzl, Ossiach (AT); Walter Rieger, Arnoldstein (AT); Markus Zundel, Egmating (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/899,101

(22) Filed: May 21, 2013

(65) Prior Publication Data

US 2013/0252423 A1    Sep. 26, 2013

Related U.S. Application Data

(62) Division of application No. 12/039,395, filed on Feb. 28, 2008, now Pat. No. 8,445,956.

(30) Foreign Application Priority Data

Feb. 28, 2007   (DE) .......................... 10 2007 009 727

(51) Int. Cl.
*H01L 29/66*          (2006.01)
(52) U.S. Cl.
USPC ............................ 438/271; 438/258; 438/589

(58) Field of Classification Search
USPC .................... 438/259, 270–274, 589, E29.201
See application file for complete search history.

(56) References Cited

U.S. PATENT DOCUMENTS

| 6,033,963 | A | 3/2000 | Huang et al. |
| 6,462,376 | B1 | 10/2002 | Wahl et al. |
| 6,867,084 | B1 | 3/2005 | Chiu et al. |
| 7,524,726 | B2 * | 4/2009 | Ma ................................. 438/270 |
| 7,800,185 | B2 * | 9/2010 | Hshieh ........................... 438/170 |
| 7,973,381 | B2 * | 7/2011 | Chiola ............................ 438/570 |

OTHER PUBLICATIONS

Non-Final Office Action mailed Jun. 22, 2011, in U.S. Appl. No. 12/039,395.

* cited by examiner

*Primary Examiner* — Cuong Q Nguyen
(74) *Attorney, Agent, or Firm* — Dicke, Billig & Czaja, PLLC

(57) ABSTRACT

A method for manufacturing a semiconductor device and semiconductor device. One embodiment provides a semiconductor substrate with an active region and a margin region bordering on the active region. The spacer layer in the margin region is broken through at a selected location and at least part of the spacer layer is removed in the active region using a common process. The location is selected such that at least part of the semiconductor mesa structure is exposed and the spacer layer in the margin region is broken through to the conductive layer and not to the semiconductor substrate.

13 Claims, 16 Drawing Sheets

$d_1{'} \equiv d_1$ (WITHIN A TOLERANCE RANGE) SO THAT TRENCH FILLING IS NOT EXPOSED IN THE ACTIVE REGION AND THE SEMICONDUCTOR IS NOT EXPOSED IN THE MARGIN REGION.

$d_1' \equiv d_1$ (WITHIN A TOLERANCE RANGE) SO THAT
TRENCH FILLING IS NOT EXPOSED
IN THE ACTIVE REGION AND THE SEMICONDUCTOR
IS NOT EXPOSED IN THE MARGIN REGION.

TERMINAL ON POLY EDGE IN THE CHIP MARGIN REGION (LAYOUT TOP VIEW)

TERMINAL ON POLY EDGE BETWEEN TWO POLY TRACES - THE CONTACT ON MESA IS PREVENTED BETWEEN THE TRACES BY THE THICKER OXIDE

D... CONTACT
C... POLY

TRENCH FIELD UNDER THE POLY CONTACT REGION

CELL FIELD SITUATION

CHIP MARGIN SITUATION

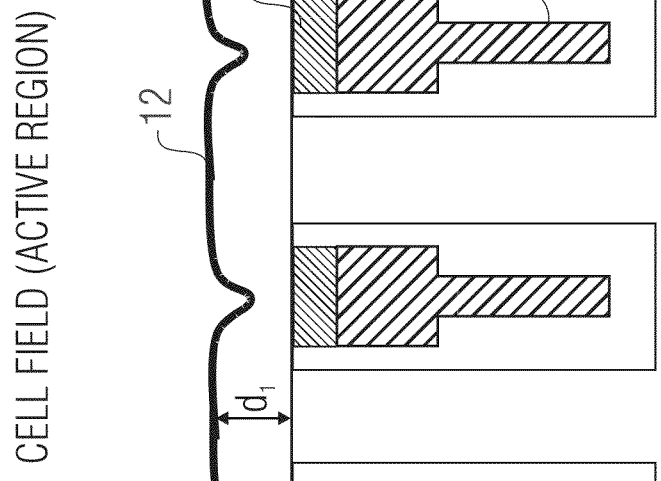
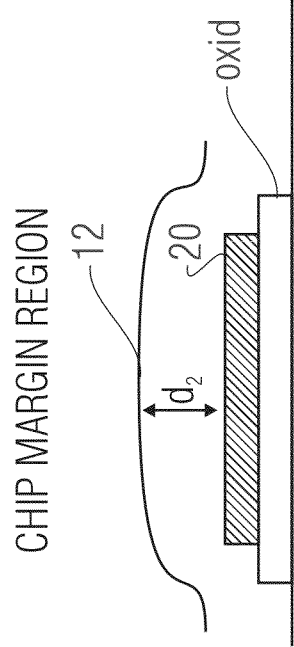

$d_1 < d_2$

- SITUATION PRIOR TO ETCHING THE SOURCE CONTACT HOLE
- EXPOSING THE SILICON MESA STRUCTURE BY MEANS OF ETCHING
  BUT: TIMELY STOP OF THE ETCHING SO THAT A SUFFICIENTLY
  THICK OXIDE LAYER REMAINS OVER THE TRENCH FILLING

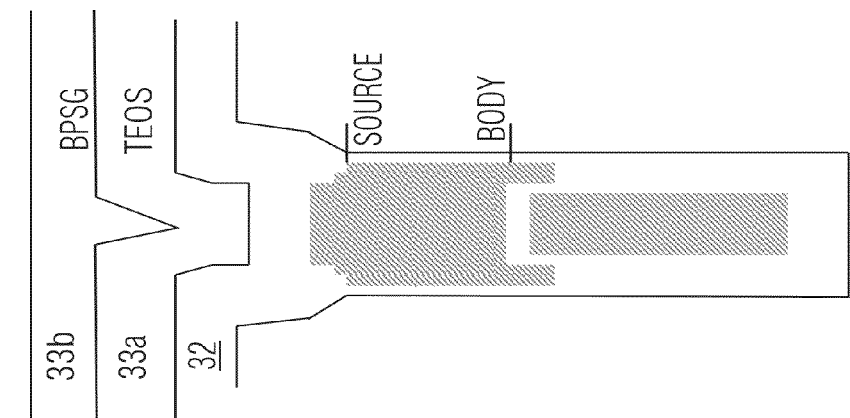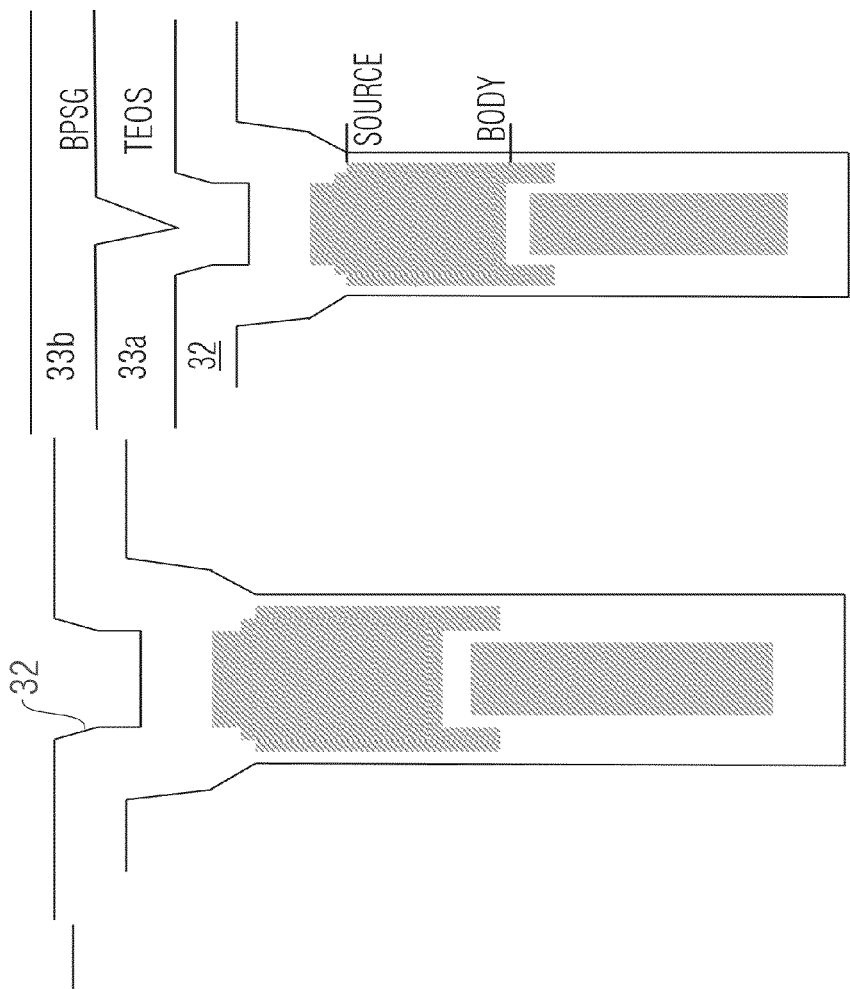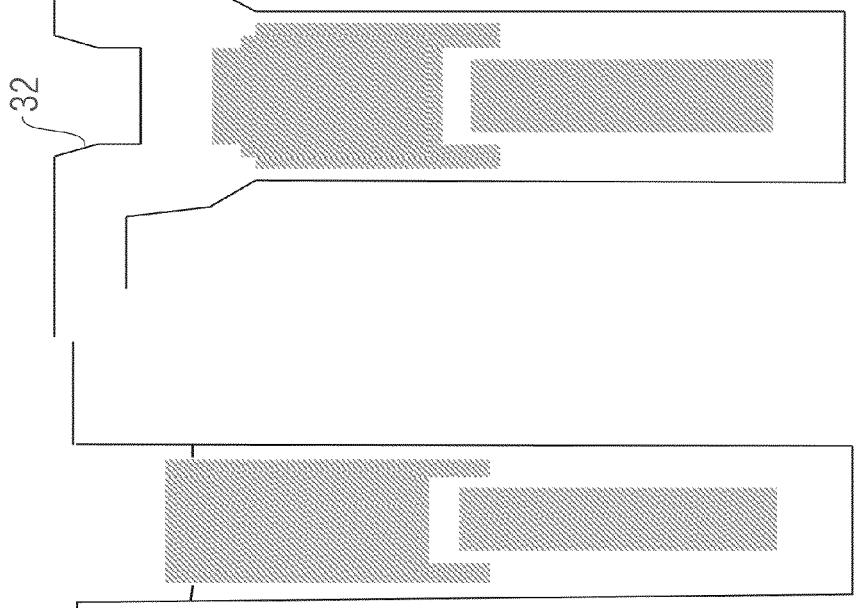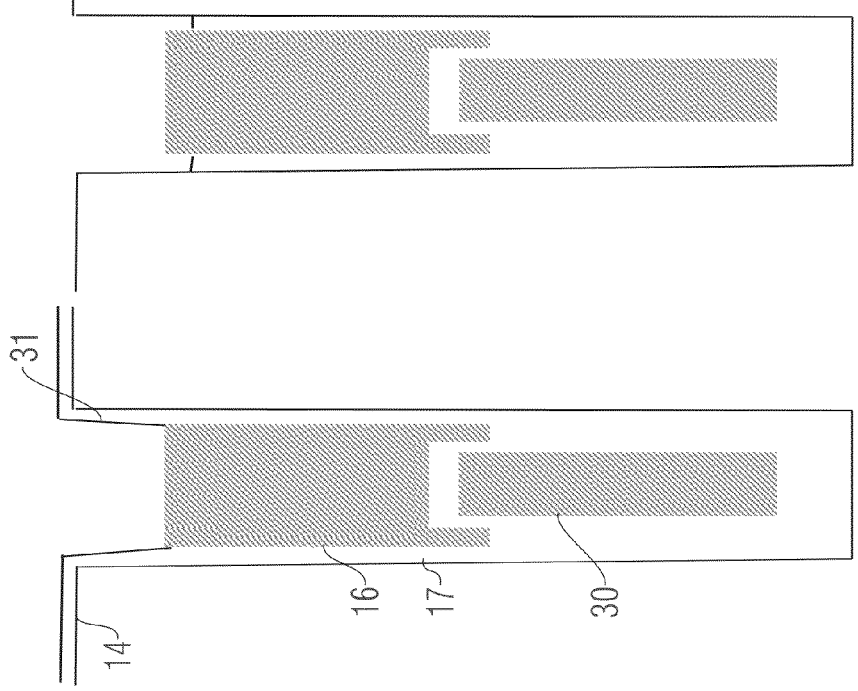

METHOD FOR MANUFACTURING A SEMICONDUCTOR DEVICE AND SEMICONDUCTOR DEVICE

CROSS-REFERENCE TO RELATED APPLICATIONS

This Utility patent application is a divisional of U.S. application Ser. No. 12/039,395, filed Feb. 28, 2008 and claims priority to German Patent Application No. DE 10 2007 009 727.3 filed on Feb. 28, 2007, which are both incorporated herein by reference.

BACKGROUND

The present invention relates to semiconductor devices and manufacturing methods for manufacturing semiconductor devices, and in one embodiment to vertical semiconductor devices.

In current power MOSFETs, also the reduction of gate-drain feedback capacity is becoming more and more important, apart from an on-resistance Rdson as small as possible. This capacity is substantially responsible for dynamic switching losses.

In an active cell field of such a power MOSFET formed as a trench transistor, this may be realized by introducing a source electrode under the gate electrode, for example. Both sorts of electrodes are realized of highly-doped polysilicon, for example. Regardless whether the gate electrode alone is present in the trench or whether a source electrode is additionally present under the gate electrode, which may also be referred to as "field plate", the electrode in the trench must nevertheless be always contacted.

This contacting may take place in the margin region, for example. In one embodiment, this connection may be manufactured by contacts on planar polysilicon in the margin region, for example. For this purpose, when etching recesses, the polysilicon is covered by a resist mask at the locations at which contacting is to take place.

Thereupon, for contacting the source region of a transistor, an oxide removal is performed in the cell field to etch the oxide away to the top edges of the semiconductor mesa structures between the trenches so as to be able to deposit a source contact metallization.

Beyond this, contacting of the gate material, or the source electrode under the gate electrode, is performed in the margin region by opening the oxide above the planar conductive layer in the margin region.

By depositing metal material into this opening in the margin region, the planar conductive layer in the margin region and, thus, the gate electrode or, if applicable, the source electrode below the gate electrode may then be contacted.

A disadvantage to this procedure is that different processing steps for the cell field are necessary, that is, on the one hand for the active region and, on the other hand, for the margin region. Thus, when the cell field is initially processed, the margin region is being covered, so that an oxide removal in the cell field does not involve the margin region. Thereupon, if an oxide removal in the margin region is to take place, the active region is being covered. If the oxide is removed at the necessary locations both in the active region and in the margin zone, a common metallization may be performed.

This step order is costly and, thus, expensive and disadvantageous particularly with regard to the danger of rejection, which may occur with every additional process step.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 10a illustrates a schematic illustration of the situation in the chip margin region in a planar poly layer after depositing the insulator intermediate layer.

FIG. 10b illustrates a schematic illustration of the cell field after depositing the insulator intermediate layer with sunken intermediate oxide in the trenches.

FIG. 11b illustrates a cross-section crossways to the trenches in the active region, section A, of FIG. 11a through a semiconductor device of FIG. 11a.

FIG. 11c illustrates a cross-section parallel to the trenches, section B, of FIG. 11a through the device of FIG. 11a.

FIGS. 12a to 12d illustrate schematic illustration of the different manufacturing steps for generating a transistor cell in the active region from the gate poly recess just before the oxide etching, or the top trench portion.

DETAILED DESCRIPTION

Figure 1:
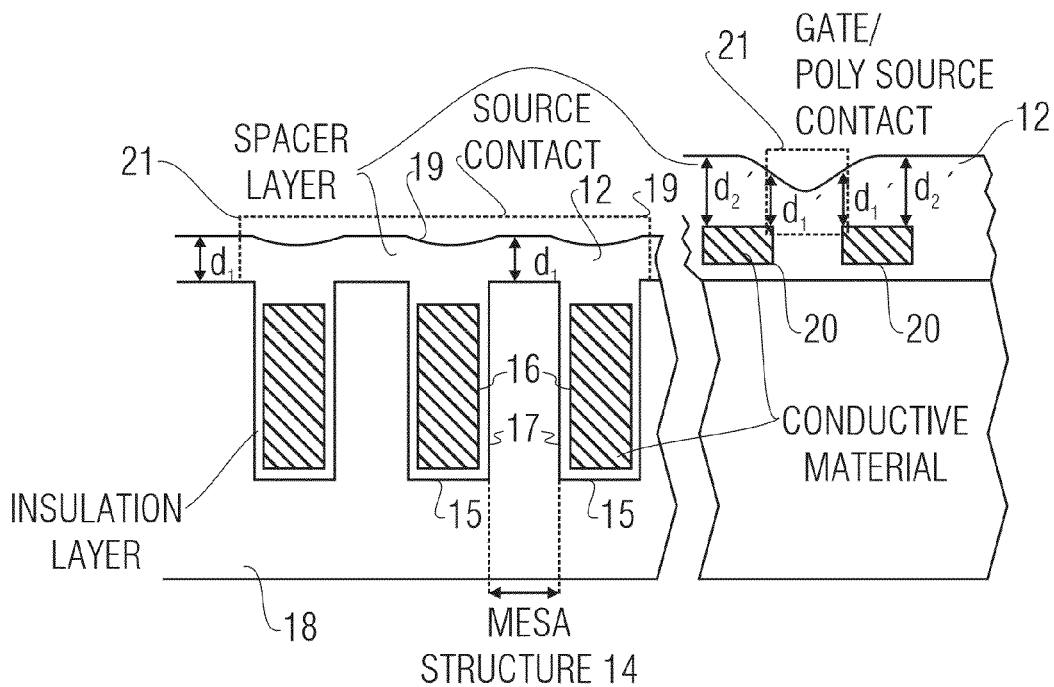
FIG. 1 illustrates a semiconductor device with an active region and a margin region.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a method for manufacturing a semiconductor device, with a process of providing a semiconductor substrate with an active region and a margin region bordering on the active region, wherein the active region includes trenches filled with conductive material in the semiconductor substrate, with the conductive material in the trenches being insulated from the semiconductor substrate by an insulation layer, and wherein a semiconductor mesa structure is formed between each two trenches, wherein a layer of the conductive material insulated from the semiconductor substrate by an insulation layer and short-circuited with the conductive material in the trenches is formed in the margin region, wherein a spacer layer including a varying thickness in the margin region is formed over the semiconductor substrate, and a process of breaking through the spacer layer in the margin region at a selected location and removing at least part of the spacer layer in the active region using a common process, wherein the location is selected such that, on the condition that the spacer layer in the active region is removed such that at least part of the semiconductor mesa structure is exposed and the conductive material in the trenches is not exposed, the spacer layer in the margin region is broken through to the conductive layer and not to the semiconductor substrate.

One embodiment provides a semiconductor device with a semiconductor substrate with an active region and a margin region bordering on the active region, the active region including trenches filled with conductive material in the semiconductor substrate, the conductive material in the trenches being insulated from the semiconductor substrate by an insulation layer, and wherein a semiconductor mesa structure is formed between each two trenches, wherein a contact patterning including a contact layer insulated from the semiconductor substrate is provided in the margin zone, wherein a spacer layer with a thickness varying from location to location is formed over the contact layer, wherein the spacer layer is broken through at one location in the margin zone at least to the contact layer; and wherein the contact patterning is formed such that a thickness of the spacer layer at the location is, within a tolerance range, smaller than or equal to a thickness of the spacer layer in a region in which a contact of the semiconductor mesa structure in the active region is laterally bounded.

Semiconductor devices include MOS power transistors or IGBTs, that is, bipolar transistors with an insulated gate. In contrast to MOS power transistors including a source region, a bordering body region in which a channel may form and a subsequent drain region, IGBT transistors have an emitter region bordering on the body region representing a top base region. A field stop layer having the same doping as the bottom base region and bordering on, at the other side thereof, a bipolar transistor collector, also referred to as "p-emitter", may then border on the semiconductor area.

FIG. 1 illustrates a schematic cross-section view of a semiconductor device with an active region 10 bordering on a margin region 11, wherein, however, the active region and the margin region in the figure do not necessarily have to be from the same cross-section, but wherein the margin region, for example, is another cross-section illustration than the active region. In FIG. 1, the spacer layer 12 illustrated in the active region 10 is also present in the margin region, there also designated 12. In one embodiment, the spacer layer 12 in the active region has a thickness $d_1$ over a semiconductor mesa structure 14. The semiconductor mesa structure 14 is defined by two trenches 15 arranged in parallel, the trenches 15 being filled with a conductive material 16, the conductive material 16 being insulated via a gate oxide 17 from the semiconductor substrate 18. With the trenches not being filled with the conductive material 16 to the top edge of the semiconductor mesa structure, but only to a particular level lying under the top edge of the semiconductor mesa structure 14, the top edge of the spacer layer 12 in the active region is not completely even, but has certain "dells" above the trenches, as is illustrated in FIG. 1 at 13. Further, in the "trench top regions" defined by the top edge of the semiconductor mesa structure and the top edge of the conductive material 16, the thickness of the spacer layer 12 over the semiconductor mesa structure, designated $d_1$, is, on the whole, smaller than a thickness $d_2$ in the margin region above a layer 20 of conductive material. The thickness of the spacer layer above the layer 20 of conductive material would be equal in the margin region if the layer of conductive material were continuous. Due to the special patterning of the layer of conductive material in the margin region into two layers bordering on each other, for example, a spacer layer 12 with a varying thickness varying between the large thickness $d_2$ and the small thickness $d_1$ is achieved in the margin region.

Thus, as illustrated in dashed lines in FIG. 1, the gate contact, or the poly source contact 21, is placed where the thickness of the spacer layer 12 above the conductive layer 20 is, within a tolerance range, equal to the thickness $d_1$ of the spacer layer 12 in the active region above the semiconductor mesa structure. Optimally, $d_1' <= d_1$ holds true, such that when the source contact illustrated at a dashed line at 21 is manufactured in the active region, the gate/poly source contact 21, too, is manufactured in the same working process. For manufacturing the source contact 22 and the gate/poly source contact 21, the same etching of the spacer layer 12 is used both in the active region and in the margin region. In the active region, the etching is performed so far that the spacer layer 21 is removed to the top edge of the semiconductor mesa structure 10, while, at the same time, the etching is not performed so far that the conductive material 16 in the trench would be exposed. It should be insulated by an insulation layer above the trench, as will be set forth later. Thus, the etching stops timely so that the trench material in the trenches is not exposed. Further, the spacer layer 12 is broken through in the margin region to the conductive layer 20, such that contacting of the conductive layer may be achieved and no oxide remains on the conductive layer, namely due to the fact that the etching has already been stopped so as not to expose the conductive electrode 16 in the trench in the active region. Further, the semiconductor material 18 is not exposed in the margin region, since otherwise a short circuit of the gate electrode or the poly source electrode in the trench with the semiconductor material will occur if a contact hole is then filled with conductive material, as will be set forth later.

The conductive layer 20 in the margin region is patterned such that there is a spacer layer 12 above the conductive layer 20, having a varying thickness. Further, this spacer layer is then broken through exactly at the location where the thickness $d_1'$ in the margin region is equal to or smaller than the thickness $d_1$ in the active region. Thus, if the thickness in the margin region of the spacer layer 12, above the conductive layer, is smaller than the thickness of the layer in the active region, a breakthrough of the spacer layer 12 will here be performed, and the thickness should be large enough so that no contacting of the semiconductor material 18 takes place. Thus, it must be ensured that the contact hole for contacting the conductive layer 20 does not reach to the semiconductor material 18, so as to avoid the short circuit.

Figure 9:
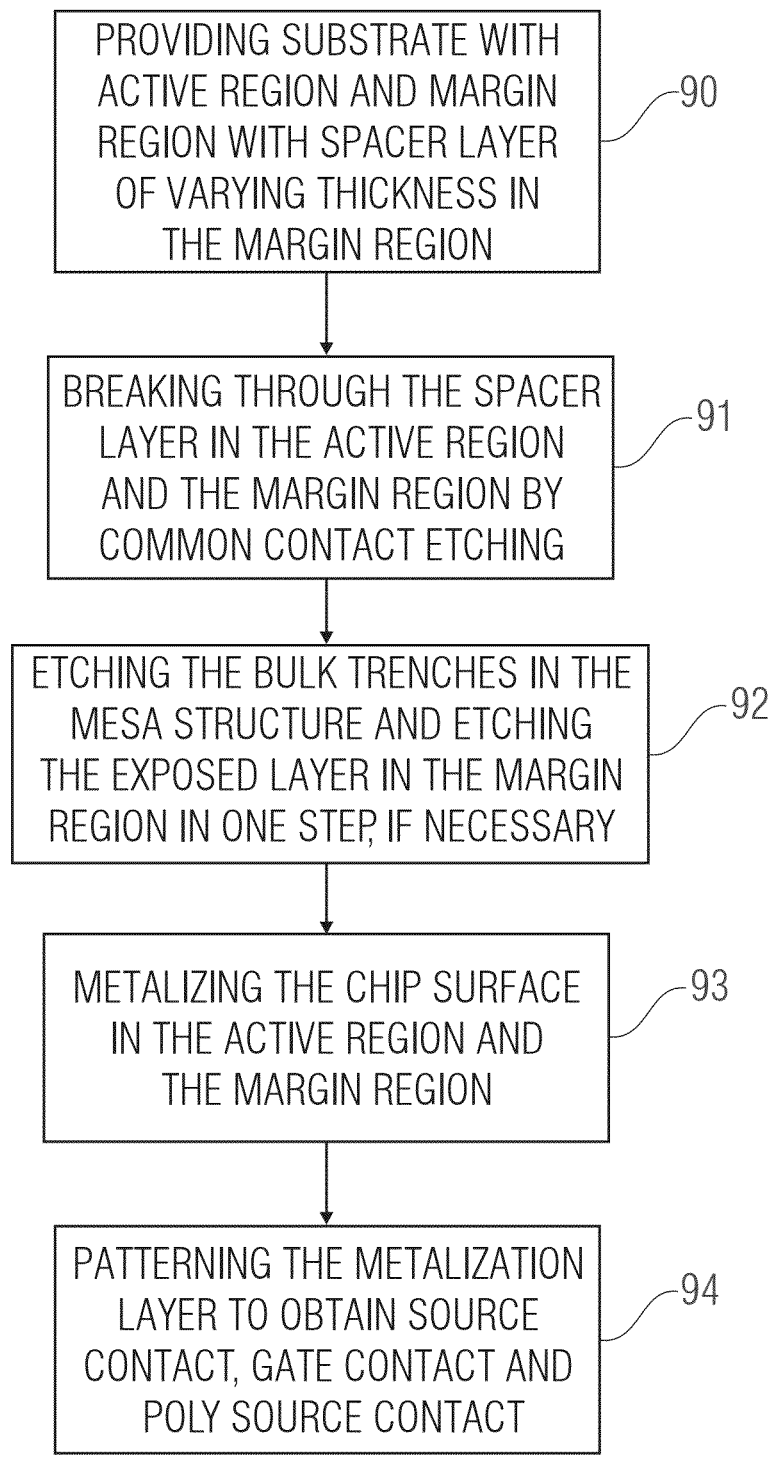
FIG. 9 illustrates a flow chart for illustrating a method for manufacturing a semiconductor device.

FIG. 9 illustrates a possible implementation of a manufacturing method for manufacturing a semiconductor element. At process 90, a substrate with an active region and a margin region is illustrated, the substrate having, in the margin region, a varying thickness of the spacer layer 12. At process 91, the spacer layer in the active region and in the margin region is then broken through by a common contact hole etching, wherein then the spacer layer in the active region will completely be removed when a planar source contact is generated in the active region, while in the margin region, the spacer layer is broken through only at the locations where contacting of a conductive layer is to be made.

Figure 5A:
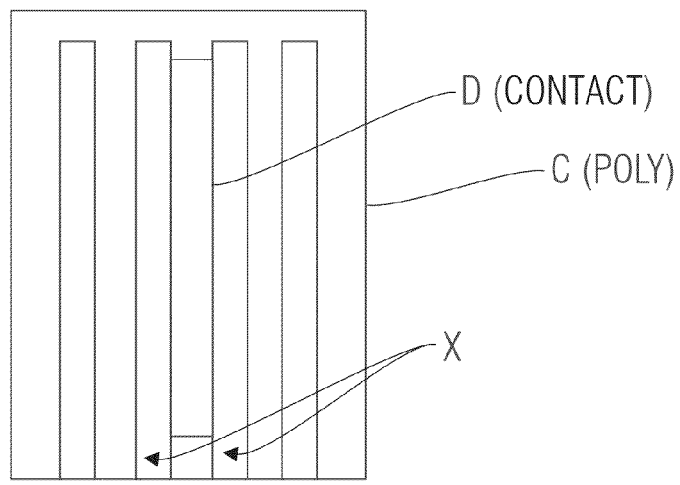
FIG. 5a illustrates a top view of one embodiment of a trench field under the poly contact region.
Figure 5B:
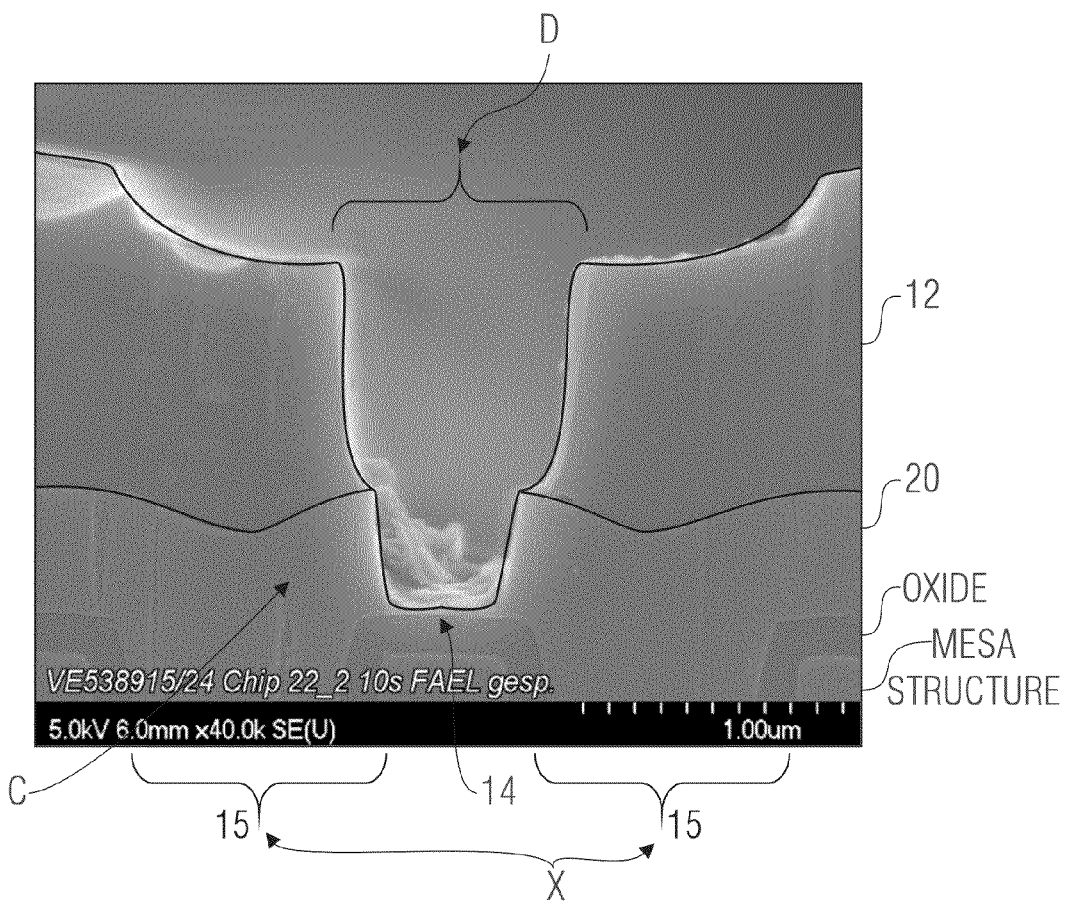
FIG. 5b illustrates an electron microscope shot of a cross-section of the structure of FIG. 2 prior to filling the contact hole.

After process 91, an etching process 92 is made in an implementation to etch the bulk trenches in the mesa structure in the active region, and further to etch the exposed layer in the margin region, too, due to the fact that no intermediate processes are made which would cover something in the margin region. The bulk trenches are illustrated at 25 in FIG. 11b, and the result in the margin region after this process 92 is illustrated in FIG. 5b.

Thereupon, in process 93, a metallization is deposited both in the active region and the margin region, filling the contact holes or the contact trenches in the margin region, covering the distance region there remaining and further also covering the exposed structures in the active region and further also covering the residues of the spacer layer bordering on the contact. With this metallization, further the region of the spacer layer between the contact holes in the margin region and the source contact is metallized, too. This intermediate region, however, is then removed at process 94 by photolithography, for example, to separate the source contact and the gate contact, or the poly source contact, from each other.

Thus, a semiconductor device thus resulting has the contact layer 20 in the margin region, which is contacted by the overlying spacer layer 12 by contact 21. This contact patterning, that is, the contact 21 to the conductive layer 20 or contact layer in the margin region is formed such that, at the location where contact 21 is located in the spacer layer 12 with more variable thickness, the thickness of the spacer layer is, within a tolerance range, smaller than or equal to the thickness of the spacer layer as is present in a region in which a contact of the semiconductor mesa structure in the active region is laterally bounded. This location is illustrated at 19 in FIG. 1, for example. There, the edge of the source contact is located, and the edge of the source contact abuts the spacer layer etched through, which still has a thickness approximately as large as the thickness of the spacer layer in which this spacer layer in the margin region has been broken through. The thickness in the margin region may also be smaller than the thickness of the spacer layer at location 19. However, at the location at which the contact is present, the thickness of the spacer layer 12 in the margin region is not larger than the thickness of the spacer layer at location 19, since otherwise a successful common etching of the active region and the contact region in the margin region would not be possible.

One or more embodiments will be explained in more detail, first an exemplary semiconductor device will be described with reference to FIGS. 11a-11d, which may be a MOS field-effect transistor but, at the same time, may also be a bipolar transistor with an insulated gate (IGBT).

Figure 11A:
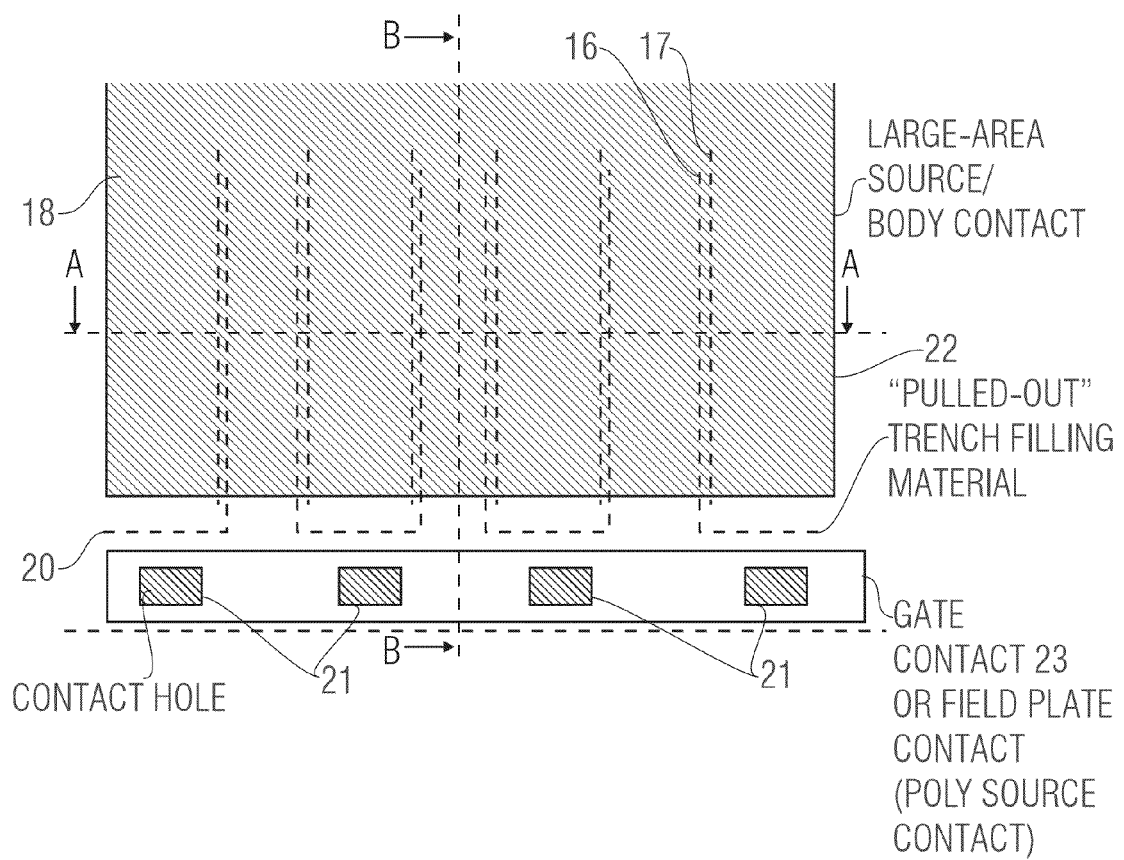
FIG. 11a illustrates a top view of a semiconductor device.

FIG. 11a illustrates a top view of such a transistor. The transistor has trenches illustrated in dashed lines and filled with conductive material 16, which are insulated from the semiconductor substrate 18 by an insulation layer 17. However, a large source contact 22 is located over the whole transistor, covering both the trenches and the conductive materials in the trenches and the oxide layers, which is the reason why the latter are drawn only in dashed lines. The source contact 22 covers the entire active region and stops, at some point, at the margin region, as illustrated in FIG. 11a. However, in the transistor exemplarily illustrated in FIG. 11a, the trenches extend a bit further and the trench filling is guided out of the trenches in the margin region so as to form the conductive layer 20. The conductive layer 20 is covered towards the top with the spacer layer, not indicated in FIG. 11a, and the spacer layer 12 is broken through by contact holes 21 filled with conductive material and connected with each other by a gate contact 23. Of course, the contact holes 21 could also be designed as a continuous contact trench, wherein this trench could then directly form the gate contact 23.

Thus, in the transistor illustrated in FIG. 11, the conductive layer 20 is formed by a "pulled-out" trench-filling material, wherein this trench-filling material pulled out at the margin may be either the gate electrode or, which will be set forth later, the poly source electrode arranged in the trench below the gate electrode.

Figure 11B:
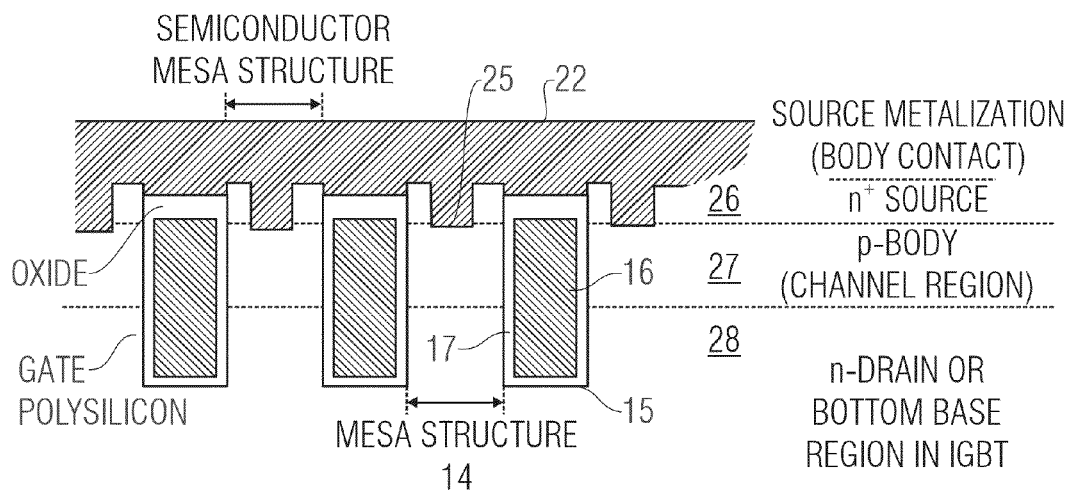

FIG. 11b illustrates a cross-section along a line AA in FIG. 11a. In one embodiment, it is illustrated that a trench is formed in the semiconductor mesa structures 14, which is illustrated at 25. When the semiconductor mesa structure 14 is exposed, this trench is then etched into the mesa structures, namely to a depth extending under the $n^+$ source regions. Thereby, when the source contact 22 is deposited and when the source contact material is introduced particularly into the trenches 25, too, a contacting of the body region may then be made, wherein, in the configuration illustrated in FIG. 11b in which contacting of the source regions and the body region is made by one and the same material, a short circuit between body and source is automatically achieved, as is desired for many transistor applications.

In one embodiment, the doping relations in FIG. 11b are such that the source region, designated 26, is highly-doped and borders on a low-doped region 27, referred to as body region, which in turn borders on a drain region 28. The region 28 and the region 26 have the same doping characteristic, which is opposed to the doping characteristic of the region 27.

In one embodiment, the regions 26 and 28 are n-doped, and the region 27 is p-doped, although the doping relations may also be reversed. If the semiconductor device is formed as a field-effect transistor, a highly-doped layer with the same characteristic and further connected to a metal electrode forming the drain of the field-effect transistor will border on the region 28.

If, in contrast, the device in FIG. 11b is a bipolar transistor with an insulated gate, the region 26 will be the emitter of the transistor, the region 27 will be the top base region and the region 28 will be the bottom base region. Further, a field stop region with higher doping will then border on the bottom base region, bordering on the collector of the transistor having a p-doping in the doping relations in FIG. 11b so as to serve as a collector or a hole emitter. In the case of the IGBT, this collector is then provided with a metallization.

Figure 11C:
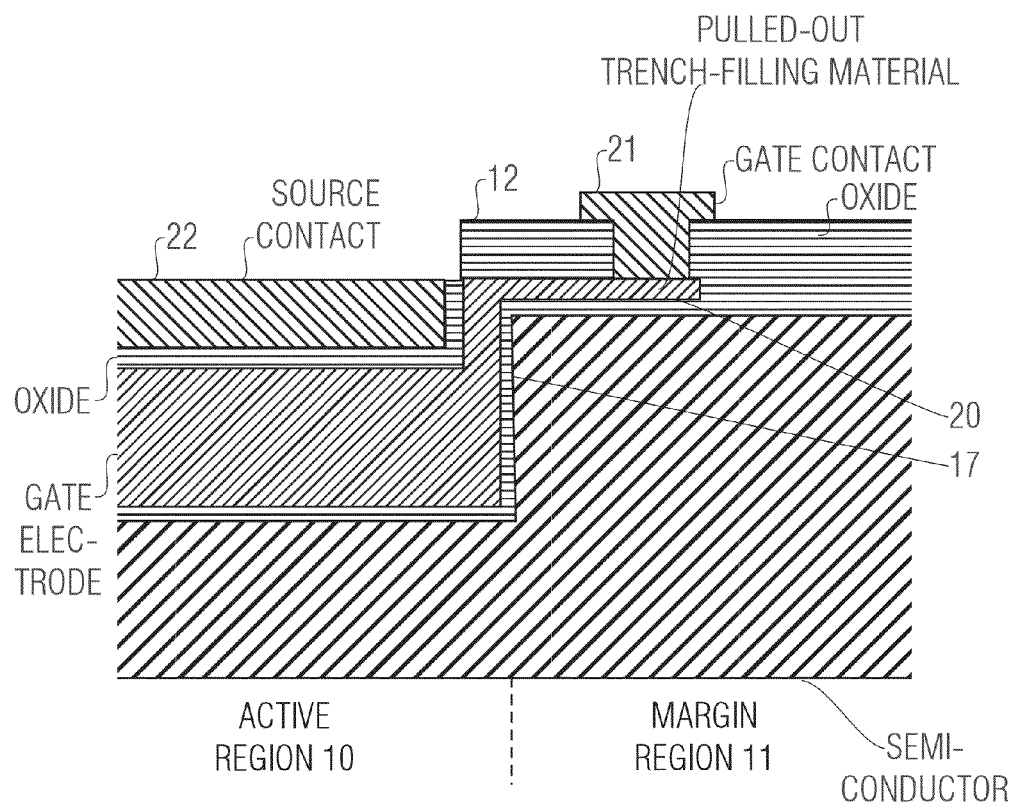
Figure 11D:
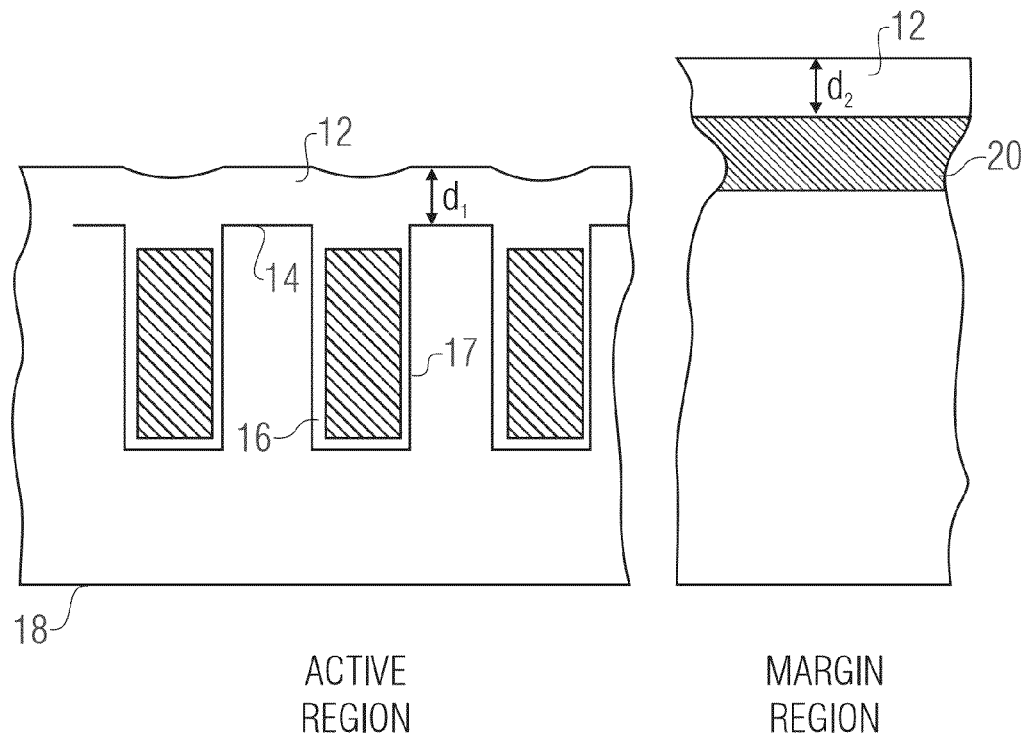
FIG. 11d illustrates a schematic illustration of the situation in the active region and in the margin region prior to the oxide etching, with oxide too thick in the margin region.

FIG. 11c illustrates a cross-section along line BB of FIG. 11a to illustrate an exemplary transition between the active region 10 and the margin region 11. The end of the source contact 22 and the bordering pulled-out portion of the trench-filling material forming layer 20 of FIG. 1, for example, are particularly interesting in FIG. 11c. Further, it is illustrated how this pulled-out portion 20 is contacted via a contact hole in which the gate contact 21 is arranged. FIG. 11d illustrates the situation of the semiconductor device before etching the source contact hole. As has been illustrated with reference to FIG. 11b and FIG. 11a, the entire surface of the active region is typically covered by a source contact for a large-area current supply to take place. Of course, also patterned source contact traces or similar could be used. However, full-area source contacts are advantageous.

A problem in the oxide etching may be that it cannot simply be extended until the oxide has been etched through also in the margin region since the electrodes in the trench would then be exposed in the cell field. Upon a subsequent metallization, the source and the electrode would thus be short-circuited.

Prior to etching the source contact hole, the spacer layer 12 is located on the semiconductor substrate in the active region. In the margin region, too, the distance region 12 is located on the pulled-out portion the trench-filling material illustrated in FIG. 11d with.

If there are no trenches in the margin region, the thickness $d_2$ in the margin region is larger than the thickness $d_1$ in the active region. If, in the scenario illustrated in FIG. 11d, the silicon mesa structure is exposed in the active region by using etching and the oxide is removed to the thickness $d_1$, in the margin region, one will not still get through to the conductive layer 20. Thus, oxide residues would remain in the margin region above the conductive layer 20 after the contact etching. A simultaneous contacting of the source cell field and drive electrodes, that is, of gate electrodes or field electrodes, is thereby prevented since the oxide thickness $d_2$ in the margin region over the poly layer 20 is significantly thicker than in the cell field. Thus, it may occur that in the case illustrated in FIG. 11d, the chip cannot be driven or its maximum breakdown voltage is not achieved anymore, such as is exemplarily illustrated also in FIG. 13c. If this problem occurs, a sufficient security has to be achieved by introducing an additional photo plane and an additional process, whereby additional costs will occur.

On the other hand, it is noted that all processes are typically optimized towards the active region in the sense of a high transistor yield, and, thus, the margin region is oriented towards the processes of the active region. Thus, if the active region does not permit any longer etching of the spacer layer 12 since a breakthrough to the conductive material in the trench would then be achieved, this etching must be stopped, regardless whether etching through has been achieved through the spacer layer 12 onto the conductive layer 20 in the margin region or not.

Subsequently, a typical sequence for manufacturing trench structures is illustrated with reference to FIGS. 12a-12d. In the trenches illustrated in FIGS. 12a-12d, two electrodes are located in the trench. The top electrode 16 represents the gate electrode and the bottom electrode 30 represents the poly source electrode or field plate electrode. While the oxide 17 next to the gate electrode 16 is a thin oxide for the transistor to include a good controllability, the oxide 17 next to the bottom electrode 30 is a thick oxide for the transistor to include a good breakthrough behavior. Based on the manufacturing stage illustrated in FIG. 12a, the residual oxide 31 still present on top of the trench is then removed in FIG. 12b. Thereupon, the postoxide 32 is grown, as illustrated in FIG. 12c. Then, as illustrated in FIG. 12d, an intermediate oxide 33a, 33b is deposited, which may be one of or a combination of PSG, USG, TEOS or nitride. Subsequently, a planarization may be performed.

Figure 13A:
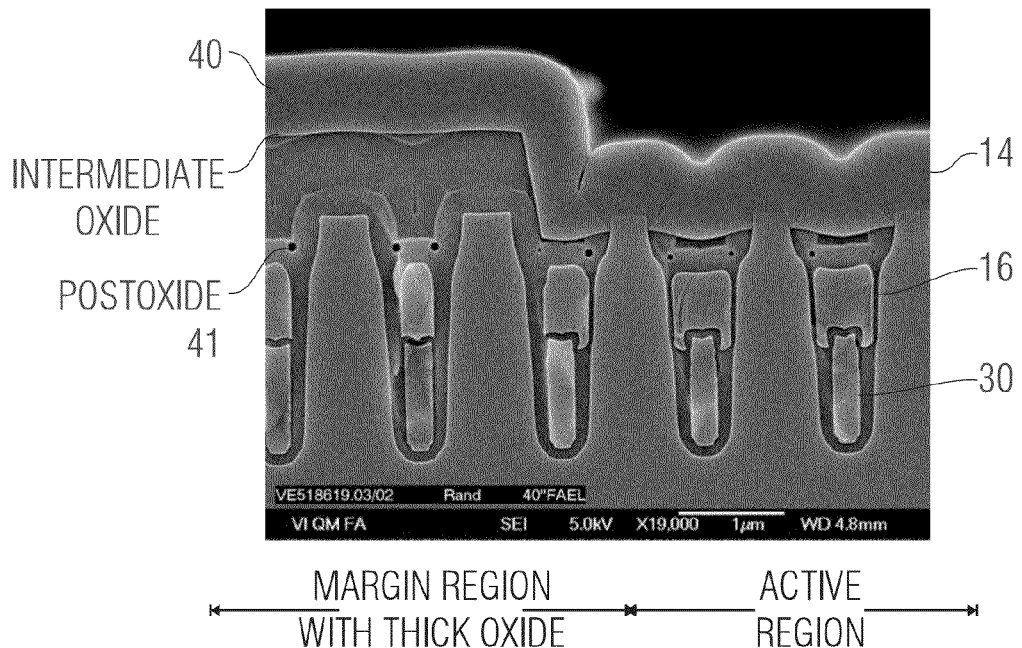
FIG. 13a illustrates a cross-section through a semiconductor device with a thick oxide-insulated trenches in the margin region and active trenches in the active region after the oxide etching.

Thereupon, the schematic device structure illustrated in FIG. 12d is subjected to an anisotropic back etching with a combination of CMP and an oxide etcher or only with an oxide etcher, to generate the source contact hole. Hereby, the oxide in the cell field is etched back under the Si edge in a defined manner, while the terminal of the edge contacts results from the cell field requirements. A schematic illustration after the etching for manufacturing the source contact hole is illustrated in FIG. 13a. Both the right trenches and the right half of the middle trench form the active region, while the left half of the middle trench and both the left trenches already represent the margin region, which may also be recognized by the conductive electrodes in the trenches being insulated from the semiconductor material by a thick oxide, while the top electrodes 16 in the active region are separated from the semiconductor only by a thin oxide 17.

Further, it should be understood that the topmost dell layer 40 is only a microscope contrast medium serving for a better preparability, which is usually not present, and that a semiconductor device is obtained without this layer after the contact hole etching in the active area has taken place while the margin region is covered. In the margin region, particularly the postoxide 41 and the intermediate oxide 33a, 33b can be seen, the postoxide and the intermediate oxide together forming the spacer layer 12.

Figure 13B:
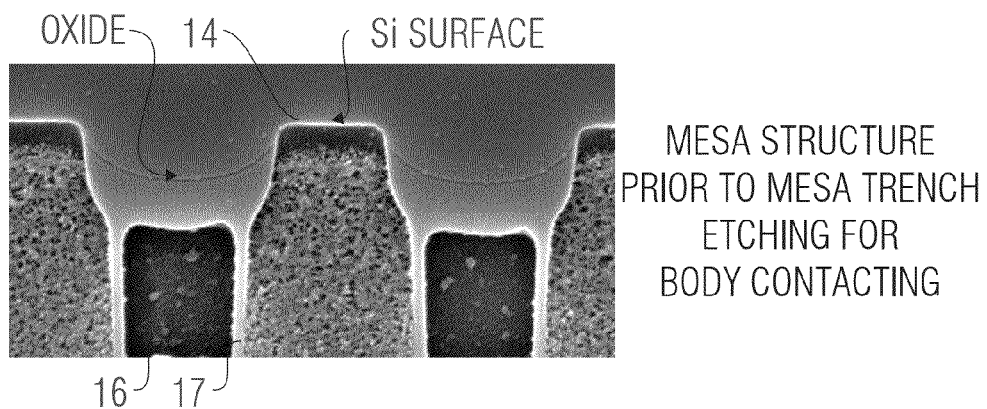
FIG. 13b illustrates an enlarged illustration of the top trench portion after the contact hole etching.

FIG. 13b illustrates an enlarged shot of the top portion of a trench in the active region after the contact hole etching. Thus, it is apparent that the surface of the semiconductor mesa structure is exposed by using etching. Since the etching is an oxide etching, the etching stops when the surface of the silicon mesa structure is exposed. In the trenches filled with oxide, however, the etching is continued so as to etch under the mesa structure top edges in a defined manner. In any case, however, the etching action is timely stopped for still some oxide to remain above the gate electrode 16, so that no short circuit is achieved between the source and the gate. It should be understood that the etching process here is not self-adjusting, since the etching process does not stop by itself above the gate electrode, but must be actively terminated.

Figure 13C:
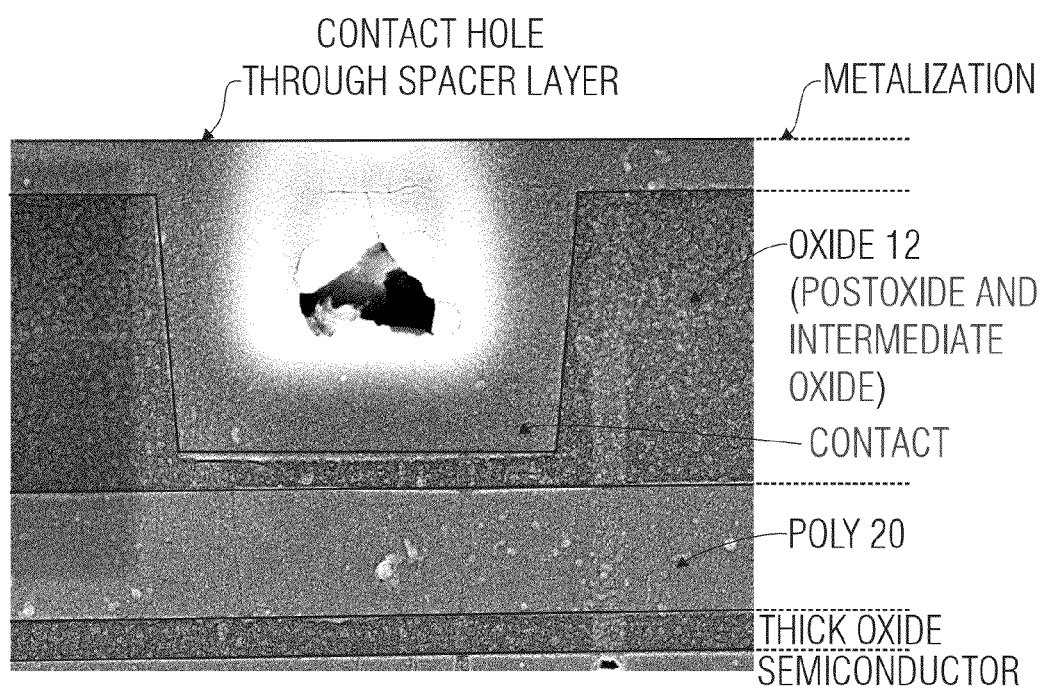
FIG. 13c illustrates a schematic microscope cross-section view of a failed contacting attempt in the margin region after the same oxide etching as illustrated in FIG. 13b.

Due to the situation described in FIG. 11d, a simultaneous etching leads to an insufficient contacting taking place in the margin region, since the spacer layer 12, referred to as oxide in FIG. 13c, is not completely broken through up to the poly layer 20, as may be seen from the microscope intersectional shot of FIG. 13c. Thus, by a skillful layout arrangement with regard to the patterning of the conductive layer in the margin region and/or placing the contact hole location in the margin region for contacting the gate electrode and/or the poly source electrode, maximum security is achieved without additional processes, that is, without additional costs.

Figure 2A:
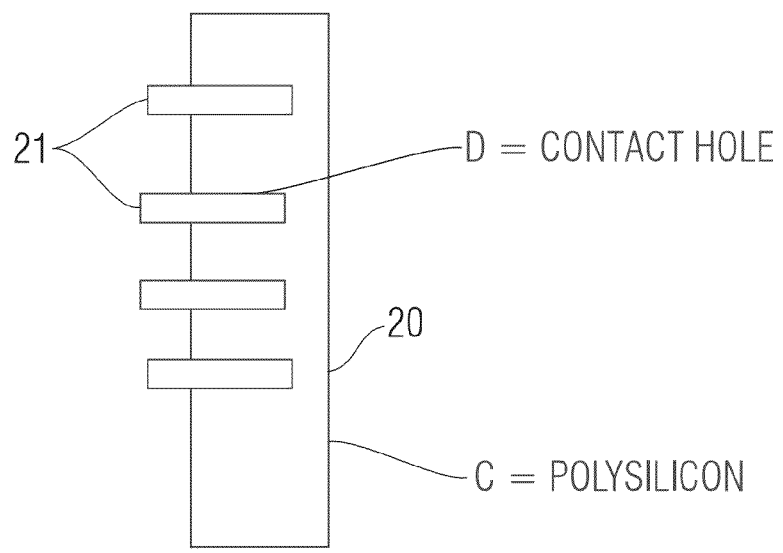
FIG. 2a illustrates a top view of a margin region for illustrating a positioning of terminals in the margin region.
Figure 2B:
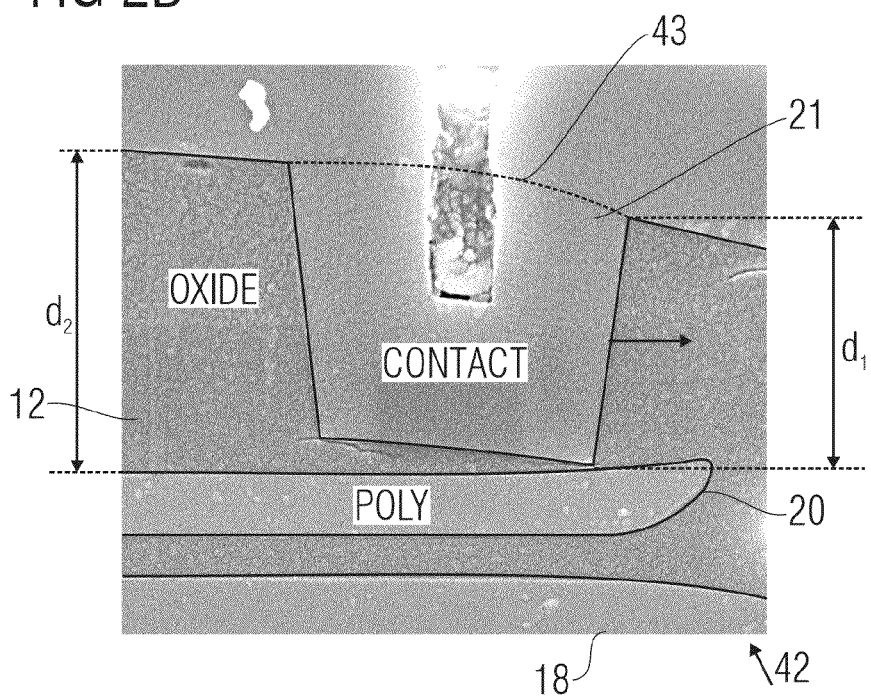
FIG. 2b illustrates a microscope shot of a cross-section of the implementation of FIG. 2a, wherein the contact here is not yet drawn over the edge of the polysilicon.

One or more embodiments include different solution approaches. One embodiment is illustrated with reference to FIGS. 2a and 2b. In one embodiment, as is illustrated in FIGS. 2a and 2b, contact 21 in the margin region is placed where the spacer layer 12 has a thinner thickness $d_1$, so that the contact hole in which the metal contact 21 is attached passes through to the poly layer 20. Since poly layer 20 is contacted next to the edge thereof, and due to the fact that oxide typically used, such as BPSG 33b of FIG. 12d, is relatively slow-flowing, the spacer layer material will "flow" into the regions next to the poly layer 20, as illustrated in FIG. 2b at 42, which results in the thickness of the spacer layer 12 varying in the proximity of the edge of the poly layer 20, as is indicated by a dashed line 43 in FIG. 2b.

Thus, the decrease in oxide thickness towards the edge is utilized. Thus, the contact is set onto the poly edge, wherein the effect of the BPSG reflow is utilized, which means that due to the surface forces, the oxide over the edge is thinner than over the planar poly region on the left-hand side in FIG. 2b, where the thickness is $d_2$.

Figure 3A:
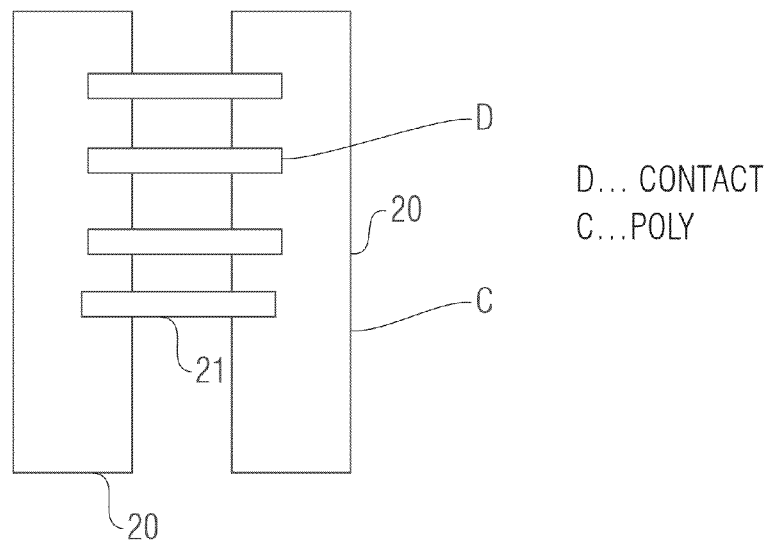
FIG. 3a illustrates a top view of a margin region for schematically illustrating a contact positioning.
Figure 3B:
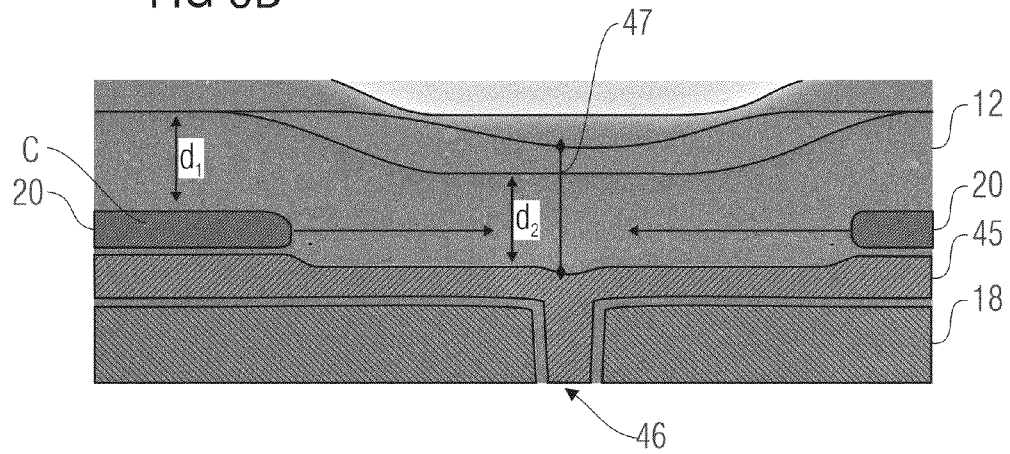
FIG. 3b illustrates a schematic microscope shot of a cross-section through a structure of FIG. 3a with an underlying poly layer and an underlying trench.

In one embodiment illustrated in FIGS. 3a and 3b, the contact is set between two poly traces, whereby etching of the silicon substrate between the traces is prevented since the oxide between the traces is thicker than over the poly traces and significantly thicker than on the poly edge, due to the reflow process. The situation illustrated in FIG. 3a thus approximately corresponds to the illustration illustrated in FIG. 1, where the contact 21 is attached between both the layers 20. FIG. 3b illustrates a cross-section through a semiconductor substrate which does not exactly correspond to the situation in FIG. 3a since, in addition to the conductive layers 20 spaced apart, yet another underlying conductive layer 45 leading to a trench 46 which will be detailed later is present. However, it can be seen in FIG. 3b that the thickness of the oxide in the proximity of the edges, illustrated at $d_1$, is substantially thinner than completely on the left-hand side or completely on the right-hand side in FIG. 3b or in the middle, wherein the higher thickness of the spacer layer 12 in the middle is illustrated at $d_2$.

It should be understood that the thickness $d_1$ above the edges approximately corresponds to the thickness $d_1$ in the active cell field. Thereby, it is ensured that etching takes place to the layers 20 and that, however, no contacting of the underlying polysilicon layer 45 takes place, due to the higher thickness between the both layers 20. In one embodiment, if this layer is not present, no contacting of the semiconductor 18 should take place, so as not to generate a short circuit between the gate-filling material and the semiconductor.

Figure 4:
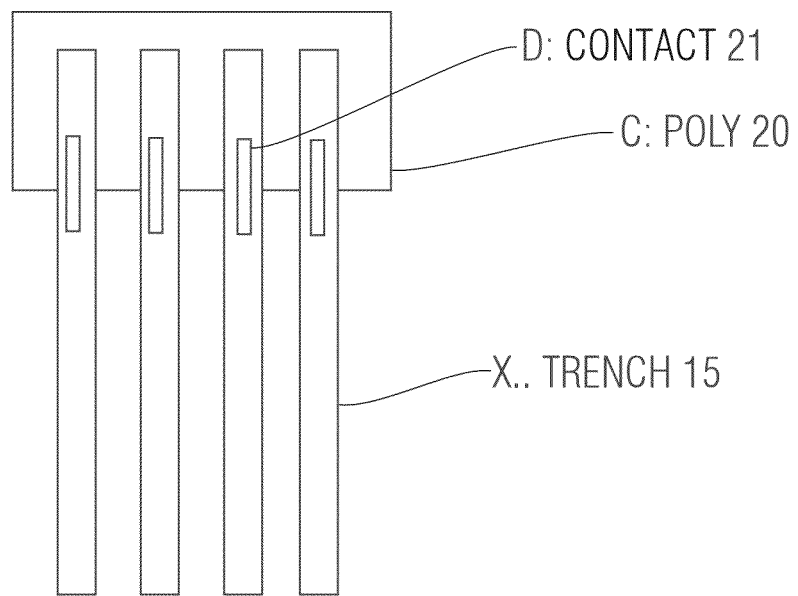
FIG. 4 illustrates a schematic top view of one embodiment of a contact on the poly edge over the trench.

FIG. 4 illustrates one embodiment, in which the contact is set onto the poly edge over the trench. Here, etching of the silicon mesa portion or the semiconductor substrate 18 is also prevented since in doubt only the polysilicon would be etched out of the trench when etching further. FIG. 4 also illustrates, in cross-section, the situation when the bottom layer 45 of FIG. 3b is to be contacted at the location designated 47, namely along the length of trench 46, that is, into the plane of the figure or out of the plane of the figure. Further, it should be understood that in this embodiment, the thickness $d_2$ illustrated in FIG. 3b is then at least as thick as thickness $d_1$ in the cell field, as illustrated in FIG. 1. However, the thickness $d_2$ could also be smaller since the oxide etching automatically stops on the polysilicon 45.

In this case, it should be in any case provided for the thickness $d_2$ to be smaller than or equal to the thickness $d_1$. This may be achieved by generating trenches in the margin region, for example, which have no gate functionality, but only serve for sinking oxide to achieve a thinner oxide level, that is, a thinner spacer layer 12, namely at the location at which contacting is to be achieved, as will be set forth later.

In any case, in the example illustrated in FIG. 3b, when a semiconductor etching takes place after the oxide etching to generate the trenches in the mesa structure which are illustrated at 25 in FIG. 11 and contact the body contact, polysilicon is etched only out of trench 46, without such an etching, however, in turn leading to a short circuit. However, if a transistor structure was built in which trenches 25 are not necessary since the body region is floating or is contacted in another manner, no polysilicon would be etched out of trench 46 in FIG. 3b.

Subsequently, a further embodiment for contact positioning is illustrated with reference to FIGS. 5a and 5b. Here, a trench field is provided under the poly contact region, and the contact is positioned between two trenches. In one embodiment, FIG. 5b illustrates a cross-section through the pull-out region in FIG. 11a, wherein, however, in comparison to FIG. 11c, the trenches continue to the end of layer 20 and do not already stop before. In one embodiment, in FIG. 5b, to adjacent trench fillings through the metallization structure 20 extending above the semiconductor mesa structure 14 are short-circuited with each other. An etching of the oxide 12, too, that is, the spacer layer, is performed to the top edge of the conductive layer 20, together with the etching of the source contact hole in the cell field. Since this layer is of polysilicon, the oxide etching stops automatically. Subsequently, the etching of the trenches 25 in the semiconductor mesa structure illustrated in FIG. 11b is performed, whereby also the conductive layer 20 is broken through in the margin region, wherein, however, this semiconductor etching again stops at the oxide above the mesa structure 14 drawn in FIG. 5b. This stopping of the etching process occurs automatically, since the etching medium etching the polysilicon does not etch any oxide, or just a little. However, it should be understood that such an automatic termination of the etching process does not take place in the active region, but the etching process must here be actively interrupted since trenches 25 would otherwise extend deeper and deeper into the semiconductor region.

Thereupon, the source contact metallization is deposited which then not only covers the source region, but also fills all openings in the spacer layer 12 and in the polysilicon layer 20, so that a good planar contact between the contact filling, not yet introduced in FIG. 5b, and the layer 20 to be contacted is achieved.

In the following, a further implementation is illustrated with reference to FIG. 6a, FIG. 6b, FIG. 7 and FIG. 8, in which dummy trench fields are deliberately introduced in the margin region, that is, trench fields as illustrated on the left-hand side in FIG. 13a, for example. Initially, the problems as already discussed with reference to FIG. 11d will be illustrated with reference to FIGS. 10a and 10b, namely, that there will be a constant high thickness $d_2$ at the chip margin above layer 20, which is typically larger than the thickness of the spacer layer 12 in the cell field, illustrated with $d_1$ in FIG. 10b, if simply a conductive layer 20 without special patterning is provided. This is due to the fact that, in the margin region, no intermediate oxide of the spacer layer 12 can sink in regions above the trenches. However, this does takes place in the cell field, since the trenches with conductive material are filled only up to a certain level, wherein this level is clearly below the mesa top edge. These regions, in which intermediate oxide sinks, are illustrated at 50 in FIG. 10*b*. With the trench geometry present in the cell field, intermediate oxide thus sinks in the trench top regions, wherein the sunken volume is strictly related to the cell field geometry. Thereby, the overall intermediate oxide thickness having the thickness $d_1$ is smaller above the trenches than in the chip margin region, which brings about the problems described.

In order to eliminate these problems, in one embodiment, trenches are introduced in the chip margin region, which are sized such that a particular amount of intermediate oxide sinks, advantageously the same amount as in the trench top regions in the cell field. However, because of the high gate drain voltage, each trench should have a thick oxide in the chip margin region, that is, an oxide having the same thickness as the oxide insulating the bottom electrode 30 in the cell field from the semiconductor. In order to sink approximately the same amount of intermediate oxide in the trenches, all trenches here are formed so wide that the deposited polysilicon forming layer 20 and being also conformly deposited into the trenches covers the trench walls and leaves free the regions, designated by reference numeral 50, for sinking the intermediate oxide.

Figure 6A:
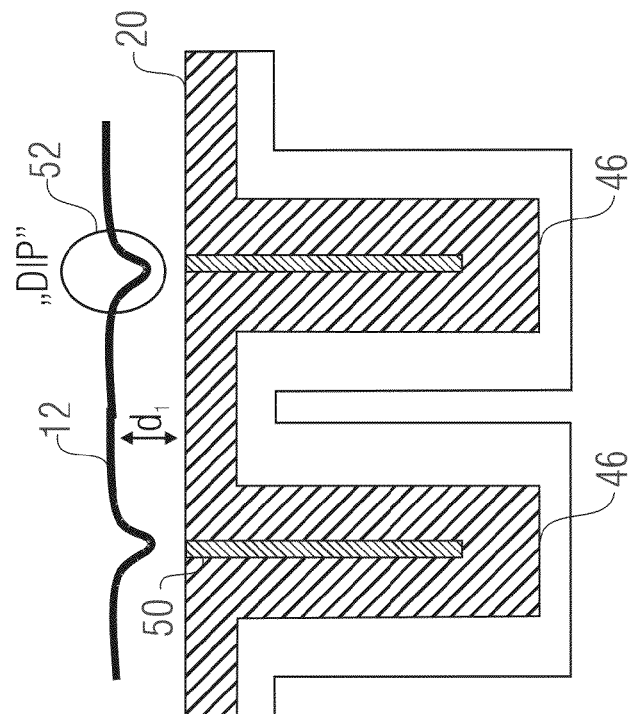
FIG. 6a illustrates a schematic illustration of the cell field situation with sunken intermediate oxide.
Figure 6B:
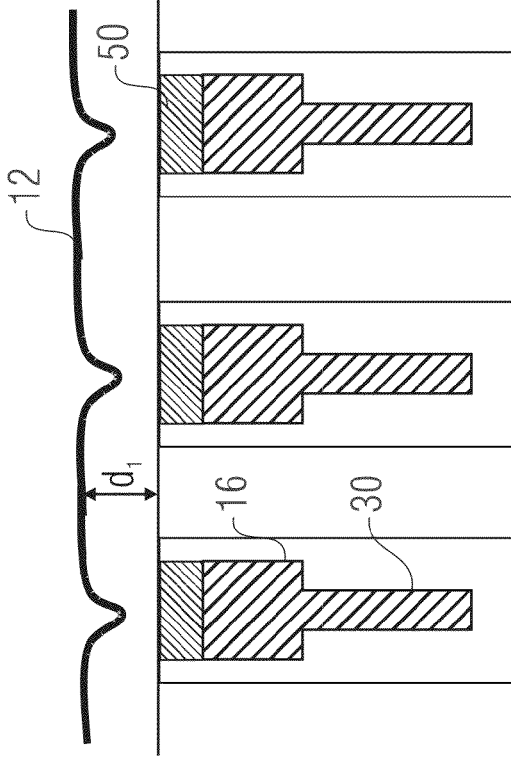
FIG. 6b illustrates a schematic illustration of the chip margin situation with a dummy trench.

Thereby, approximately the same intermediate oxide thickness as in the cell field, illustrated as $d_1$ in FIGS. 6*a* and 6*b*, results over the polysilicon layer 20 at the chip margin. Thus, the conductive layer 20 may be contacted everywhere in the chip margin region, namely either in dip 52 formed directly above the sunken location or in the region between two dips since the maximum thickness of the spacer layer in the chip margin region above layer 20 is not larger than in the cell field either. In the dip region 52, the layer is even thinner, which, however, is not problematic since the oxide etching stops at the polysilicon anyway and may etch some intermediate oxide out of region 50, if the contact is attached directly above the trench. However, this is not problematic either and may even serve for improving the contact if this region is filled up by metal in the later metallization of the margin contact and the source contact in the cell field.

Figure 8:
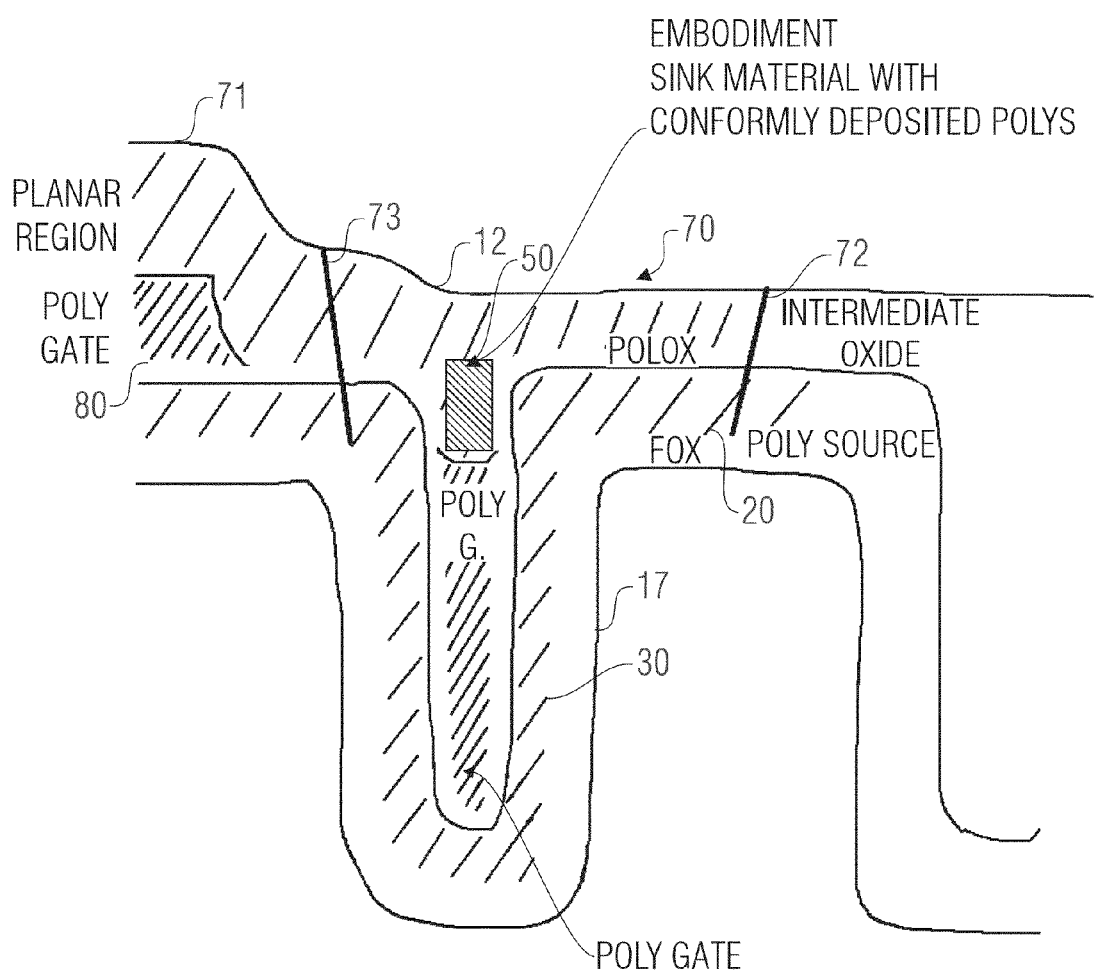
FIG. 8 illustrates a schematic illustration of the effectiveness of a "dummy trench".

In FIG. 8, the dark rectangle schematically illustrates the volume into which the intermediate oxide may flow when tempering, which, thus, decreases the effective intermediate oxide thickness on the mesa lying next to it. In one design, the contacting of the poly source material next to the "dummy trench" at the margin region is attached there, too.

Thus, the contact in the chip margin region will be selected everywhere where the thickness of the spacer layer is equal to or smaller than the thickness of the spacer layer in the active region, that is, in the cell field.

By the cell geometries, such as trench width, trench depth, recess depth, poly thickness, mesa width etc. being established by the desired performance of the MOSFET, a particular intermediate oxide thickness (IMOX thickness) automatically results over the cell field. In contrast to this, a usually thicker intermediate oxide thickness which is different to that results in the planar chip margin region, as has been illustrated. However, the poly contacts are located there, so that the described problems develop. Both this different intermediate oxide thicknesses thus cannot be etched through securely in a single contact hole etching process. By providing dummy trenches insulated from the semiconductor by thick oxide in order not to endanger the voltage sustaining capability, almost the same intermediate oxide thickness is now generated also in the chip margin region in which the poly contacts are located so as to be able to securely manufacture all contacts in one process, one phototechnique. For this purpose, special wider dummy trench structures are introduced under the poly contact regions, in which just as much intermediate oxide volume may be sunk that there is, again, approximately the same intermediate oxide thickness as in the cell field.

The trench width may be any size, depending on the desired volume of the material to be sunk. In general, the material may be any insulating material used in the semiconductor field. This principle may even be applied in the case in which two conducting materials are to be brought to approximately the same layer thickness, that is, also for metal traces or poly traces, for example. Thus, as an alternative to an insulation layer, the spacer layer may also be a conductive layer. In the illustrated examples, one poly or several polys may be present in the dummy trenches, and they all may lie on solid potentials or at least be floating, except for the polysilicon to be contacted.

Further, the poly regions in the margin trench regions may be conformly present in the trench or may partly be recess-etched. The mesa regions between the dummy trench fields may have a fixed size or may vary. In this context, the mesa width may also be selected so small that the mesa regions at least partly oxidize together. The trench fields themselves may have the most different forms in the layout, e.g., stripes, rectangles, chequer patterns, trench needles, trench circles or trench ellipses. In the case of trench circles or trench ellipses, a dummy trench field may be layouted as a whole, without having to deploy T-pieces. In one embodiment, this may bring about advantages for voltage data larger than 40 volt since the transistor is precisely terminated towards the margin. The layout of the contact hole at least partly laid over the dummy trench field may further include any forms and sizes, however, it should be within the trench field.

In general, apart from the cell field, a MOSFET contains at least one further structure in which trenches wider than in the cell field are formed, and at least one overlying layer whose layer thickness is reduced by sinking material into these wider trenches, compared to a structure without the trenches. Further, it is not necessarily polysilicon that has to be in the trenches, but rather, the trenches may also be manufactured only to serve as an oxide sink, without being filled with polysilicon. Regardless whether the trenches are filled with polysilicon or not, or whether they are only filled with oxide, if the thicknesses of the spacer layer in the cell field and in the chip margin region are relatively similar, the dip alone may already be sufficient since the thickness in the dip 52 is thinner than elsewhere in the chip margin. In other words, in the embodiment illustrated in FIG. 6*b*, for example, a contact may be placed directly into the dip 52 if the thickness of the oxide in the dip is as large as $d_1$ in the cell field and if the thickness of the spacer layer 12 between two trenches, or between two dips, is significantly larger than in the cell field.

Figure 7:
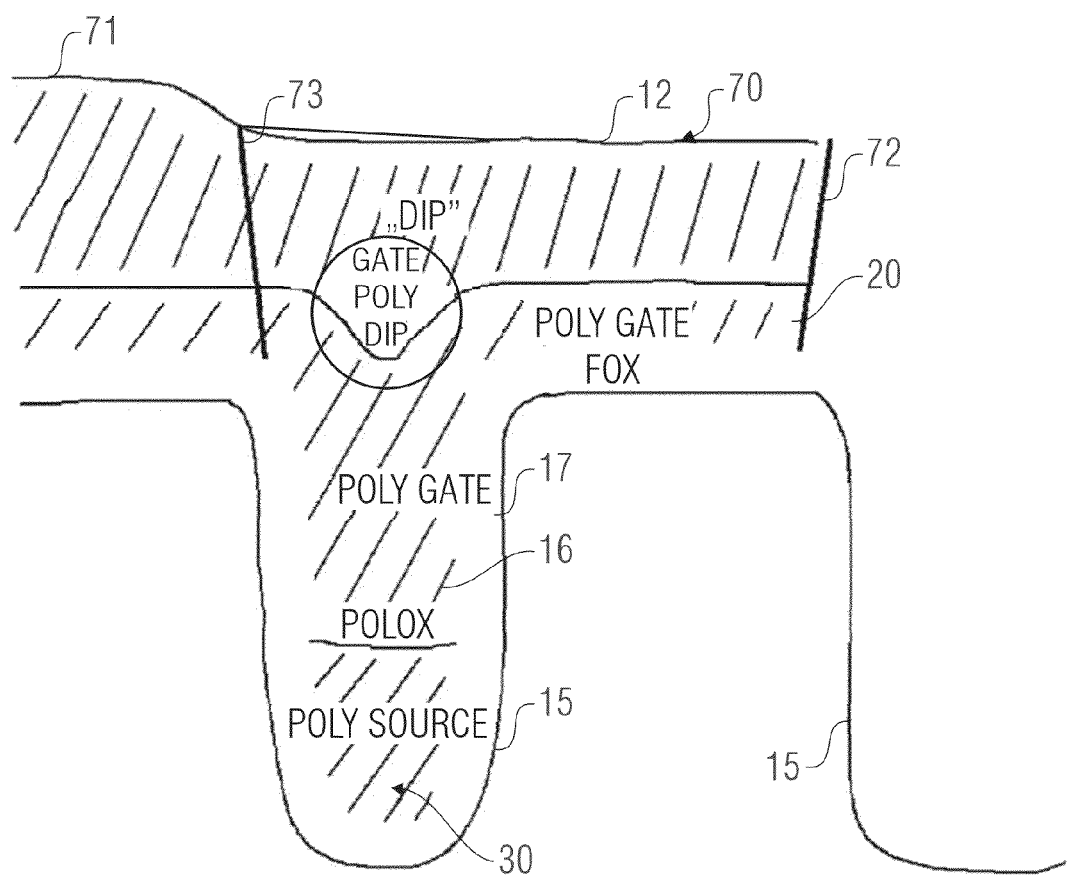
FIG. 7 illustrates a schematic illustration for contacting the poly gates in the margin region.

In the following, one embodiment is illustrated with reference to FIG. 7, in which only the poly gate contact is to be contacted and the poly source is not connected, that is, remains floating. In one embodiment, the dip also referred to as gate poly dip in FIG. 7 is illustrated. Through this gate poly dip, intermediate oxide is initially taken in, so that between trenches 15, that is, at a location 70, the spacer layer is thinner than in the margin region at 71 since several trenches 15 are disposed next to each other. Depending on the design, the dip may also continue to the top edge, as illustrated in FIG. 6, or the dip may not be viewable anymore at the top edge of the spacer layer 12, as drawn in dashed lines in FIG. 7.

Nevertheless, the volume of the gate poly dip serves for sinking enough intermediate oxide to have a thinner spacer layer between trenches in which intermediate oxide has been sunk, so as to there deposit a contact. The possibilities of a contact deposition are indicated by boundary lines 72 and 73, wherein the contact does not necessarily have to be so wide that it extends between 72 and 73, but may be also narrower.

One embodiment for contacting the poly source material in the trenches is illustrated in FIG. 8. Here, the poly source material, that is, the electrode 30, is guided out to serve, at the margin, as conductive layer 20 to be connected, wherein, in turn, a terminal may be achieved in the region between lines 72 and 73. Again, a volume exists, is designated 50 in FIG. 8, into which the intermediate oxide may be sunk, so that a thinner intermediate oxide results in the proximity of several trenches than at the margin. The thickness at the location 70 in FIG. 8 is thus smaller than the thickness at a location 71. Further, it can be seen that in the embodiment illustrated in FIG. 8, the poly gate material in the trench is separated at 80 in FIG. 8 from a poly gate material present outside.

If the contacts are placed such as is illustrated in FIG. 8 by lines 72 and 73 and if an oxide etching is performed such that not only the intermediate oxide thickness 12 is etched through but also the sunken volume 50, in this implementation the poly gate could be short-circuited with the poly source by the contact hole filling and be laid on source potential, for example. However, this is only of interest for dummy trenches, that is, for trenches in which the poly gate electrode does not represent an actual gate in the active field. There, of course, no short circuit between poly source and poly gate may be achieved. For such a case, however, the patterning of FIG. 8 might be used, namely if the contact of layer 20 is manufactured over a semiconductor mesa region, so that the contact does not contact the poly gate in FIG. 8.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for manufacturing a semiconductor device, comprising:
   providing a semiconductor substrate with an active region and a margin region adjacent to the active region, wherein the active region comprises trenches filled with conductive material in the semiconductor substrate; and
   breaking through a spacer layer having varying thickness, in the margin region at a selected location and removing at least part of the spacer layer in the active region; and
   selecting the location such that, on condition that the spacer layer in the active region is removed such that at least part of the semiconductor mesa structure is exposed and the conductive material in the trenches is not exposed, the spacer layer in the margin region is removed to the conductive layer and not to the semiconductor substrate.

2. The method of claim 1, wherein removing comprises anisotropic etching acting equally on the active region and the margin region.

3. The method of claim 2, wherein the etching comprises a combination of a chemical-mechanical polishing and an oxide etching or an oxide etching without any chemical-mechanical polishing.

4. The method of claim 1, comprising performing a trench etching in the semiconductor mesa structure after the breaking through, without covering the location in the margin region.

5. A method for manufacturing a semiconductor device, comprising:
   providing a semiconductor substrate with an active region and a margin region adjacent to the active region, wherein the active region comprises trenches filled with conductive material in the semiconductor substrate, wherein the conductive material in the trenches is insulated from the semiconductor substrate by an insulation layer, and wherein a semiconductor mesa structure is formed between each two trenches, wherein a layer of the conductive material, insulated from the semiconductor substrate by an insulation layer and short-circuited with the conductive material in the trenches, is formed in the margin region, and wherein a spacer layer comprising a varying thickness in the margin region is formed over the semiconductor substrate; and
   breaking through the spacer layer in the margin region at a selected location and removing at least part of the spacer layer in the active region, using a common process,
   wherein the location is selected such that, on condition that the spacer layer in the active region is removed such that at least part of the semiconductor mesa structure is exposed and the conductive material in the trenches is not exposed, the spacer layer in the margin region is removed to the conductive layer and not to the semiconductor substrate.

6. The method of claim 5, wherein the common process comprises anisotropic etching acting equally on the active region and the margin region.

7. The method of claim 6, wherein the etching comprises a combination of a chemical-mechanical polishing and an oxide etching or an oxide etching without any chemical-mechanical polishing.

8. The method of claim 5, comprising performing a trench etching in the semiconductor mesa structure after the breaking through, without covering the location in the margin region.

9. The method of claim 5, comprising metalizing the active region and the margin region after the breaking through and a resulting metallization layer is subsequently patterned to separate a contact of the active region from a contact of the margin region.

10. The method of claim 5, wherein the spacer layer comprises a material which becomes more liquid with increasing temperature and in which the spacer layer is deposited at a temperature at which the material is so liquid that it diffuses into a dimple or acquires a thickness decreasing towards an edge.

11. The method of claim 5, comprising patterning the contact layer in the margin region such that it comprises an edge at which the contact layer stops, wherein the spacer layer comprises, over the contact layer, a thickness decreasing towards the edge, and wherein the location is selected near the edge so that the spacer layer is removed to the contact layer in the common process.

12. The method of claim 5, wherein the contact layer in the margin region comprises at least two adjacent traces spaced apart from each other, wherein the spacer layer comprises a thickness decreasing over the one trace in the direction of the other trace and decreasing over the other trace in the direction of the one trace, transversely to the adjacent traces, and in which the location comprises a continuous region including part of the one trace, a gap between the traces and a bordering part of the other trace.

13. The method of claim 5, comprising:
   forming a trench under the contact layer in the margin region; and
   selecting the location such that it extends over the trench.

* * * * *